United States Patent
Wang et al.

(10) Patent No.: US 12,381,064 B2
(45) Date of Patent: Aug. 5, 2025

(54) ARCHITECTURE FOR LARGE ACTIVE AREA HIGH SPEED DETECTOR

(71) Applicant: ASML Netherlands B.V., Veldhoven (NL)

(72) Inventors: Yongxin Wang, San Ramon, CA (US); Zhonghua Dong, Sunnyvale, CA (US); Rui-Ling Lai, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 895 days.

(21) Appl. No.: 17/044,840

(22) PCT Filed: Mar. 14, 2019

(86) PCT No.: PCT/EP2019/056504
§ 371 (c)(1),
(2) Date: Oct. 1, 2020

(87) PCT Pub. No.: WO2019/192821
PCT Pub. Date: Oct. 10, 2019

(65) Prior Publication Data
US 2021/0134557 A1 May 6, 2021

Related U.S. Application Data

(60) Provisional application No. 62/651,650, filed on Apr. 2, 2018.

(51) Int. Cl.
*H01J 37/244* (2006.01)
*H10F 39/00* (2025.01)
*H01J 37/28* (2006.01)

(52) U.S. Cl.
CPC .......... *H01J 37/244* (2013.01); *H10F 39/809* (2025.01); *H01J 37/28* (2013.01); *H01J 2237/2448* (2013.01)

(58) Field of Classification Search
CPC .. H01J 37/244; H01J 37/28; H01J 2237/2448; H01J 2237/2446; H01L 27/14634
See application file for complete search history.

(56) References Cited

U.S. PATENT DOCUMENTS 6,137,151 A      10/2000   Street
7,723,695 B2 *   5/2010    Watanabe ......... H01L 27/14659
                                                250/370.11
(Continued)

FOREIGN PATENT DOCUMENTS

CN      101609835 A    12/2009
JP      2009-139346 A   6/2009
(Continued)

OTHER PUBLICATIONS

Notification of Reason(s) for Refusal issued in related Korean Patent Application No. 10-2020-7028380; mailed Jul. 19, 2022 (9 pgs.).

(Continued)

*Primary Examiner* — David P Porta
*Assistant Examiner* — Mamadou Faye
(74) *Attorney, Agent, or Firm* — Finnegan, Henderson, Farabow, Garrett & Dunner, LLP

(57) ABSTRACT

Detectors and detection systems are disclosed. According to certain embodiments, a substrate comprises a plurality of sensing elements including a first plurality of the sensing elements and a second plurality of the sensing elements, and a plurality of sections configured to connect the first plurality to an output, and connect the second plurality to an output. Switching regions may be provided between the sensing elements that are configured to connect two or more sensing elements. The switching region may be controlled based on signals generated in response to the sensing (Continued)

elements receiving electrons with a predetermined amount of energy and/or beam intensity.

15 Claims, 14 Drawing Sheets

(56) References Cited

U.S. PATENT DOCUMENTS

| | | | |
|---|---|---|---|
| 8,120,683 B1* | 2/2012 | Tumer | H01L 27/14634 |
| | | | 348/295 |
| 2002/0030166 A1 | 3/2002 | Hiroi et al. | |
| 2005/0206873 A1* | 9/2005 | Tanaka | G02B 7/32 |
| | | | 356/4.03 |
| 2007/0228423 A1 | 10/2007 | Watanabe et al. | |
| 2008/0165921 A1* | 7/2008 | Tkaczyk | A61B 6/032 |
| | | | 250/366 |
| 2009/0127435 A1* | 5/2009 | Mochizuki | H01L 27/12 |
| | | | 250/208.1 |
| 2011/0291007 A1 | 12/2011 | Wang et al. | |
| 2013/0245989 A1 | 9/2013 | Kadowaki et al. | |
| 2015/0221471 A1 | 8/2015 | Hatano et al. | |
| 2016/0035451 A1* | 2/2016 | Tsuji | A61B 6/4452 |
| | | | 378/62 |
| 2017/0329025 A1 | 11/2017 | Brown et al. | |
| 2017/0373115 A1* | 12/2017 | Menichelli | G01T 1/164 |

FOREIGN PATENT DOCUMENTS

| | | |
|---|---|---|
| JP | 2011146395 A | 7/2011 |
| JP | 2013-132034 A | 7/2013 |
| JP | 2013542547 A | 11/2013 |
| JP | 2018-500545 | 1/2018 |
| JP | 2018-508789 | 3/2018 |
| KR | 10-2017-0113149 A | 10/2017 |
| TW | 201727882 A | 8/2017 |
| TW | 201743049 A | 12/2017 |
| WO | WO 2017/156854 A1 | 9/2017 |

OTHER PUBLICATIONS

Office Action of the Intellectual Property Office of Taiwan issued in related Taiwanese Patent Application No. 108111123; mailed Oct. 21, 2020 (9 pgs.).

Charge-coupled device, Wikipedia, the free encyclopedia, Jul. 12, 2012 (Jul. 12, 2012), XP055091211.

Barry Burke et al: "CCD Technology", Experimental Astronomy; an International Journal On Astronomical Instrumentation and Data Analysis, Kluwer Academic Publishers, DO, vol. 19, No. 1-3, May 23, 2006 (May 23, 2006), pp. 69-102.

Chen Wet Al: "High resistivity silicon active pixel sensors for recording data from STEM", Nuclear Instruments & Methods in Physics Research. Section A, Elsevier BV * North-Holland, NL, vol. 512, No. 1-2, Oct. 11, 2003 (Oct. 11, 2003), pp. 368-377.

International Search Report issued in related PCT International Application No. PCT/EP2019/056504, mailed Aug. 30, 2019 (4 pgs.).

Notice of Reason for Rejection issued in related Japanese Patent Application No. 2020-546935; mailed Oct. 12, 2021 (11 pgs.).

* cited by examiner

ARCHITECTURE FOR LARGE ACTIVE AREA HIGH SPEED DETECTOR

CROSS-REFERENCE TO RELATED APPLICATIONS

This application claims priority to International Application No. PCT/EP2019/056504, filed Mar. 14, 2019, and published as WO 2019/192821 A1, which claims priority of U.S. application 62/651,650 which was filed on Apr. 2, 2018. The contents of these applications are incorporated herein by reference in their entireties.

FIELD

The description herein relates to detectors, and more particularly, to detectors that may be applicable to charged particle detection.

BACKGROUND

Detectors can be used for sensing physically observable phenomena. For example, electron microscopes may comprise detectors that collect charged particles projected from a sample, and that output a detection signal. Detection signals can be used to reconstruct images of sample structures under inspection and may be used, for example, to reveal defects in the sample.

In some applications, an area detector may comprise a pixelated array of electron sensing elements that can detect one or more electron beams projected thereon. Detectors may be provided with signal routing circuitries arranged adjacent to the array of sensing elements, for example as a circuit die stacked together with a sensor die.

As detector arrays become larger, wiring associated with signal processing and signal readout may become longer. For example, the physical distances between sensing elements in a detector array and associated signal processing circuitries may be large due to the size of the detector array active area or the position of the sensing elements. Accordingly, interconnections between individual sensing elements and signal processing circuitries may become very long, which may introduce higher series resistance, parasitic capacitance, and series inductance. Furthermore, many interconnected components may be added to circuit dies. As wiring length becomes longer, and components are added to circuits, communications speed may suffer. For example, parasitic parameters may induce signal fidelity losses and may be incurred at various portions of the circuitries when attempting to route analog signals out of a sensor.

Some applications may demand high speed, high throughput, high bandwidth, and the like. Such complications as those discussed above may result in bandwidth reduction, especially if interconnections are not well planned and designed. This may prevent a detection system from achieving desired bandwidth, such as that ordered by design specifications. In addition, long interconnections within analog signal paths may introduce higher noise and interference to the signal paths. As a result, a signal-to-noise ratio of the detection system may be deteriorated.

SUMMARY

Embodiments of the present disclosure provide systems and methods for providing a detector. In some embodiments, a charged particle beam detection system is provided. The charged particle beam detection system may include a detector.

In some embodiments, a detector is provided that comprises a substrate including a plurality of sensing elements, and a plurality of sections including a first section connecting a first group of the plurality of sensing elements to an output and a second section connecting a second group of the plurality of sensing elements to an output.

According to some embodiments, an arrangement may be achieved that resolve issues arising from long wiring length without sacrificing performance or flexibility of a detection system. Dividing the plurality of sensing elements making up a detector into arrays of smaller sections may reduce the effects of parasitic parameters such as resistance, capacitance, and inductance. Interconnections may be made between sensing elements and their associated analog signal processing circuitries that may reduce detrimental effects on bandwidth of a detection system. Furthermore, using a digital multiplexer following analog signal processing circuitries and signal paths may achieve improved signal routing. Flexibility of a detection system may be maintained without incurring deterioration of signal fidelity.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the disclosure. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments, as claimed.

BRIEF DESCRIPTION OF THE DRAWINGS

The above and other aspects of the present disclosure will become more apparent from the description of exemplary embodiments, taken in conjunction with the accompanying drawings in which.

DETAILED DESCRIPTION OF THE DRAWINGS

Figure 1:
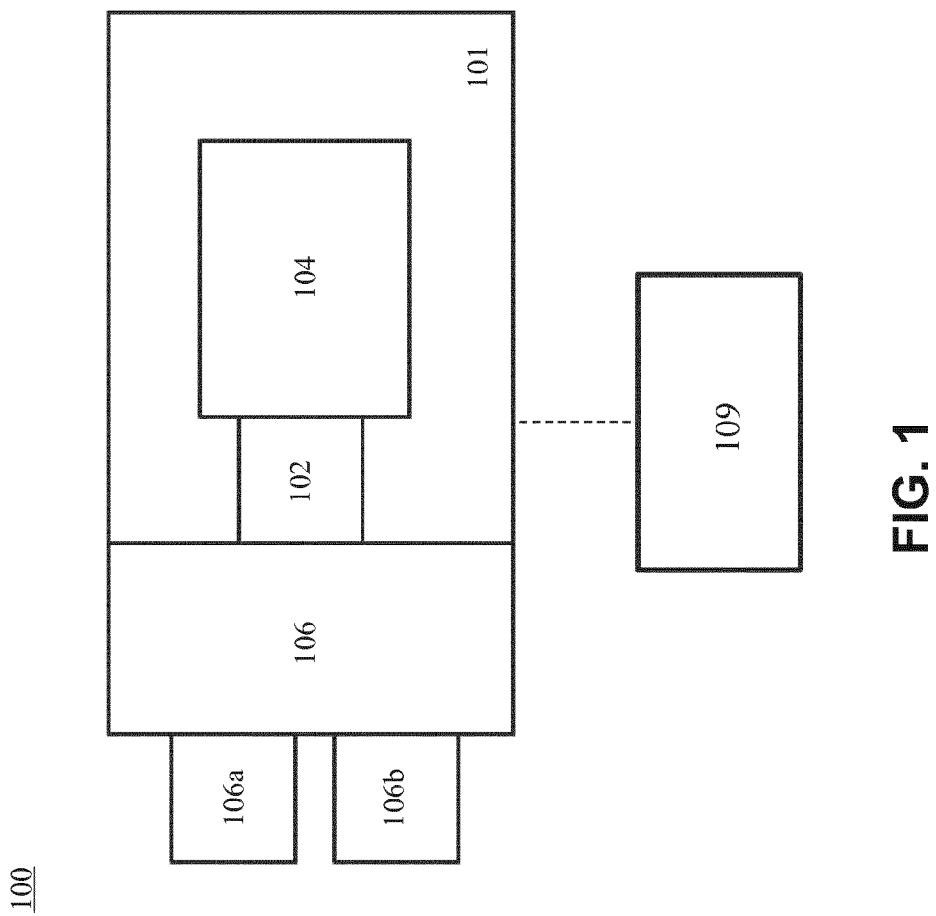
FIG. 1 is a schematic diagram illustrating an exemplary electron beam inspection (EBI) system, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to the subject matter as recited in the appended claims. For example, although some embodiments are described in the context of providing detectors in systems utilizing electron beams, the disclosure is not so limited. Other types of charged particle beams may be similarly applied. Furthermore, detectors may be used in other imaging systems, such as optical imaging, photo detection, x-ray detection, etc.

Embodiments of the present disclosure may provide a detector. The detector may have an array architecture. The detector may be used in a detection system that may be useful in, for example, a charged particle system for charged particle imaging. The charged particle system may be a scanning electron microscope (SEM) tool for imaging and inspecting a sample. The charged particle system may be used for defect detection, for example.

In some exemplary embodiments, a detection system is provided comprising a detector with a plurality of sensing elements that is divided into sections. The sections may be uniform. For example, each of the sections may have the same number of sensing elements. The sections may have the same shape and the same size as one another. Each section may have corresponding signal processing circuitries and signal paths. Sensing elements of one section may be associated with the signal processing circuitries and signal paths of the corresponding section.

The detector may be provided with one or a plurality of substrates, such as dies. For example, there may be a sensor die and a circuit die. The dies may be stacked in a thickness direction of the detector. For example, a detector may be formed as a substantially planar member having sensing elements arrayed in a two-dimensional plane. The sensor die may comprise the sensing elements, and the circuit die may comprise signal processing circuitries. The sensor die and the circuit die may be stacked together with each other in a stacking direction orthogonal to the plane of the array of sensing elements.

In some embodiments, a detector section may be arranged directly above its corresponding signal processing circuitries and signal paths.

Size and shape of detector sections may be determined so that any interconnection between sensing elements and corresponding signal processing circuitries and signal paths avoid introducing parasitic capacitance, resistance, and inductance. Such parasitics may cause reduction of overall bandwidth of a detection system. For example, a detection system with specified characteristics of, e.g., bandwidth, among other things, given by a design specification may not be feasible because of parasitic parameters. In addition, noise and interference may be introduced by interconnections, and such effects should not reduce the signal-to-noise ratio of the system to below design specifications.

In some embodiments, size of a detector section and arrangement of associated signal processing circuitries and signal paths may be configured so that all electron beam spots projected on the detector surface are guaranteed to be received by at least one section. Beam spots may be received by a section, and signals from each electron beam spot may have a signal path assigned to it at any given time.

In some embodiments, criteria for determining a size of sections may be as follows. For example, under any imaging condition, at most only one node in an electron beam spot grid will fall into one section. For a rectangular grid of electron beam spots, the criteria for choosing the size of sections may be that the diagonal size of the section is less than the length of the smallest pitch of electron beam spots in the grid. Thus, at most, only one beam center will be located in one section. In this way, it may be guaranteed that there will be enough signal processing circuitries and signal paths to accommodate signal processing and readout of the beams projected on an area of the detector surface.

At the output of a section, a digitized signal may be generated that represents the intensity of the electron beam spot received by the detector section and its corresponding signal processing circuitries and signal paths. A digital multiplexer may be connected to the outputs of the signal processing circuitries and signal paths of the sections. The multiplexer may gather data from active signal processing circuitries and signal paths that process the signals from respective electron beam spots.

The size of the group of sensing elements for each electron beam spot may be less than, equal to, or larger than the size of the predefined detector section. For example, a detector may be provided that groups and merges sensing elements associated with an electron beam spot. When a plurality of sensing elements are merged, their combined electron detection signal may be routed to the signal processing circuitry and signal path of one section, even if some of the sensing elements are not contained in the predefined section.

The detection system may be configured so that the number of electron beam spots projected on the detector surface is less than or equal to the number of signal processing circuitries and signal paths of the sections. At any given time, some of the signal processing circuitries and signal paths may be disabled. Some of the signal processing circuitries and signal paths may be inactive based on a predetermined requirement.

In some embodiments, additional interconnections may be added. For example, additional interconnections may be provided in a circuit die. The interconnections may be provided in the same circuit die that includes the signal processing circuitries and signal paths of the sections. Some or all of the interconnections may be connected to the sensing elements and the input of the signal processing circuitries and signal paths. The interconnections may include switches.

When the additional interconnections are connected in parallel with existing interconnections, it may be possible to further reduce the effects of parasitic parameters on bandwidth. Furthermore, the additional interconnections may provide additional signal routing flexibilities for signals of each electron beam spot. Moreover, if the number of active signal processing circuitries and signal paths needed is less than the number of signal processing circuitries and signal paths built into the die, the additional interconnections provide a possible way to improve the capability of failure tolerance. For example, in case one or more signal processing circuitries and signal paths malfunction, the detection system may still work without function or performance deterioration.

The signal processing circuitries and signal paths, as discussed herein, may refer to structures contained in one section element. A section element may comprise one or more circuits. There may also be provided circuitry components, logical elements, wiring paths, and so on. It will be understood that signal processing circuitries and signal paths may be interpreted as including signal processing circuitries and/or signal paths.

Reference is now made to FIG. 1, which illustrates an exemplary electron beam inspection (EBI) system 100 that may include a detector consistent with embodiments of the present disclosure. EBI system 100 may be used for imaging. As shown in FIG. 1, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 can part of the structure.

Figure 2:
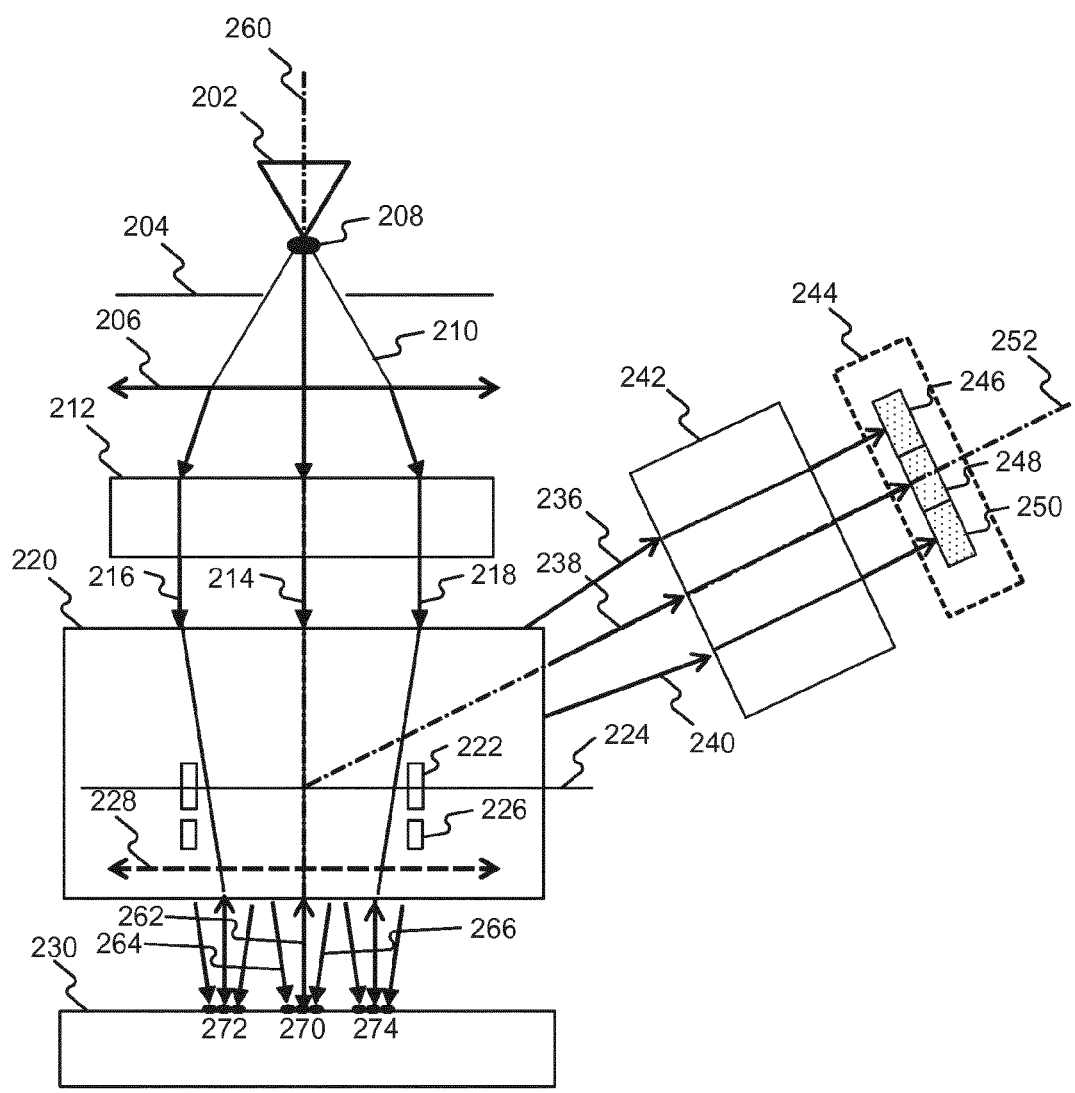
FIG. 2 is a schematic diagram illustrating an exemplary electron beam tool, consistent with embodiments of the present disclosure that may be a part of the exemplary electron beam inspection system of FIG. 1.

Reference is now made to FIG. 2, which illustrates an electron beam tool 104 (also referred to herein as apparatus 104) comprising an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2), multiple secondary electron beams 236, 238, and 240, a secondary optical system 242, and an electron detection device 244. Primary projection optical system 220 may comprise a beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with a primary optical axis 260 of apparatus 104. Secondary optical system 242 and electron detection device 244 may be aligned with a secondary optical axis 252 of apparatus 104.

Electron source 202 may comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 may block off peripheral electrons of primary electron beam 210 to reduce size of probe spots 270, 272, and 274.

Source conversion unit 212 may comprise an array of image-forming elements (not shown in FIG. 2) and an array of beam-limit apertures (not shown in FIG. 2). The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 210. The array of beam-limit apertures may limit the plurality of beamlets 214, 216, and 218.

Condenser lens 206 may focus primary electron beam 210. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Objective lens 228 may focus beamlets 214, 216, and 218 onto a wafer 230 for inspection and may form a plurality of probe spots 270, 272, and 274 on the surface of wafer 230.

Beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 may also be non-zero. Beam separator 222 may separate secondary electron beams 236, 238, and 240 from beamlets 214, 216, and 218 and direct secondary electron beams 236, 238, and 240 towards secondary optical system 242.

Deflection scanning unit 226 may deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons and backscattered electrons. Secondary optical system 242 may focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of surface area of wafer 230.

Figure 3:
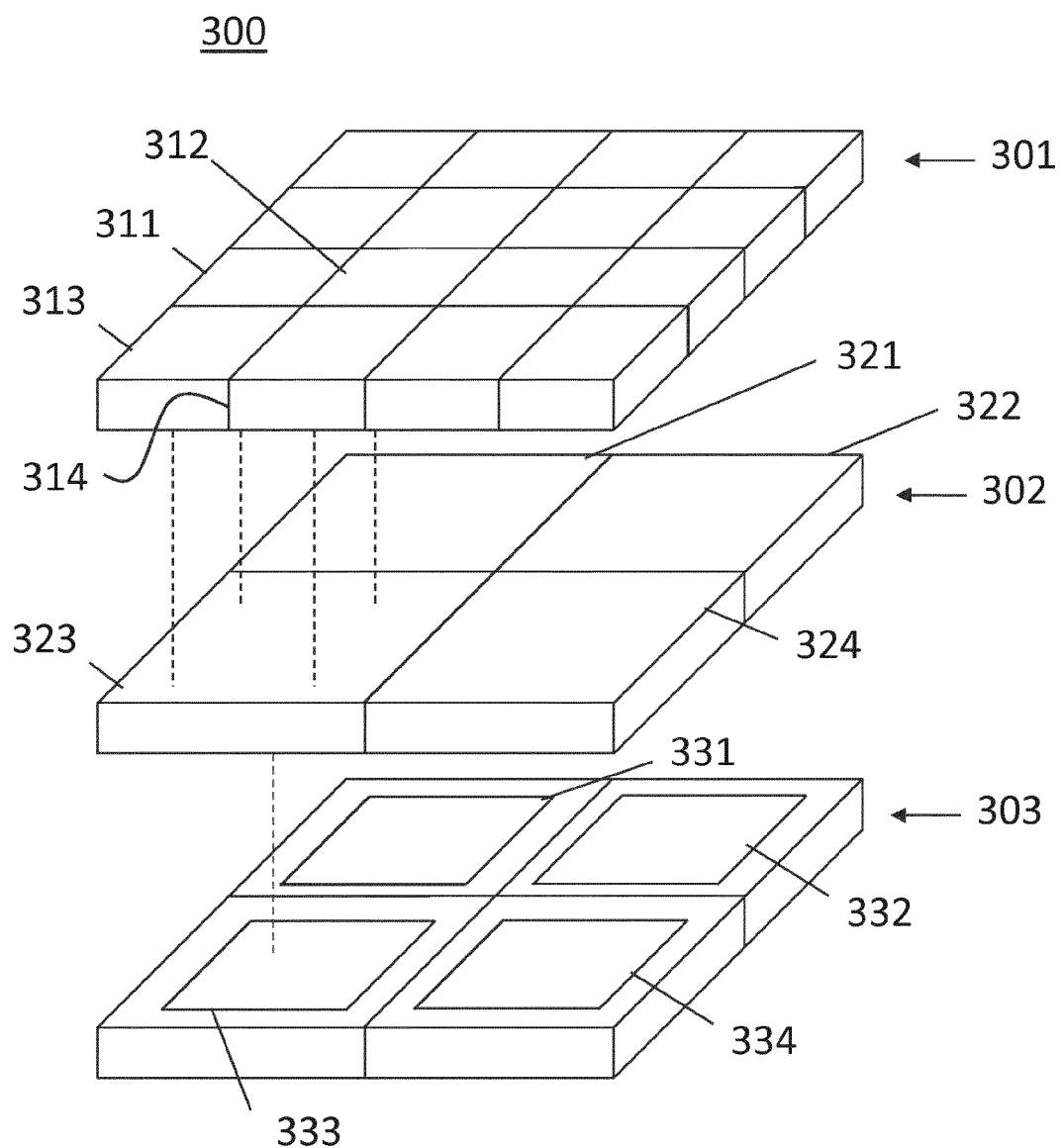
FIG. 3 is a schematic representation of an exemplary structure of a detector, consistent with embodiments of the present disclosure.

Reference is now made to FIG. 3, which illustrates a schematic representation of an exemplary structure of a detector 300. Detector 300 may be provided as electron detection device 244.

Detector 300 comprises a sensor layer 301, a section layer 302, and a read-out layer 303. Sensor layer 301 may include a sensor die made up of a plurality of sensing elements 311, 312, 313, 314, and so on. For example, the plurality of sensing elements may be provided in an array of sensing elements having uniform size and shape, and uniform arrangement.

Section layer 302 may include a plurality of sections 321, 322, 323, and 324. The sections may include wiring paths configured to connect one or more sensing elements among the plurality of sensing elements. For example, as shown in FIG. 3, section 323 may be configured to electrically connect outputs of sensing elements 311, 312, 313, and 314. Section 323 may be configured to output combined signals gathered from sensing elements 311, 312, 313, and 314 as a common output. The sections may be configured to connect to sensing elements placed directly above the section. For example, a section may have a grid of terminals configured to connect with the outputs of multiple sensing elements. The sections may be provided in an array structure such that the sections have uniform size and shape, and uniform arrangement. The sections may be square shaped, for instance. An isolation area may be provided between adjacent sections to electrically insulate them from one another. In some embodiments, sections may be arranged in an offset pattern, such as tile layout.

Section layer 302 may comprise a semiconductor substrate including one or more wiring paths and other circuitry elements. For example, section layer 302 may comprise a base substrate with a plurality of wiring paths provided on the base substrate, wherein each of the plurality of wiring paths is associated with one section. Wiring paths may include lines of conductive material printed on the base substrate, flexible wires, bonding wires, and the like. One or more switches may also be provided. For example, switches may be provided between an input to and an output from a section. Switches may be provided so that outputs of individual sensing elements can be connected or disconnected with the common output of the section. Corresponding circuitries for controlling the switches may also be provided in section layer 302. In some embodiments, switches may be provided in a separate switch matrix that may itself contain circuitries for controlling the switches.

Read-out layer 303 may include signal processing circuitries for processing outputs of the sensing elements. Signal processing circuitries may be provided that correspond with each of the sections of section layer 302. A plurality of separate signal processing circuitry sections may be provided. The signal processing circuitry sections may be provided in an array of sections having uniform size and shape, and uniform arrangement. For example, read-out layer 303 may be provided with a plurality of signal processing circuitry sections 331, 332, 333, and 334. The signal processing circuitry sections may be configured to connect with an output from corresponding sections of section layer 302. For example, as shown in FIG. 3, signal processing circuitry section 333 may be configured to electrically connect to an output of section 323.

Read-out layer 303 may include input and output terminals. Output of read-out layer 303 may be connected to a component for reading and interpreting the output of detector 300. For example, read-out layer 303 may be directly connected to a digital multiplexer, digital logic block, controller, computer, or the like.

Arrangements of sensor layer 301, section layer 302, and read-out layer 303 may correspond with one another in a stacked relationship. For example, section layer 302 may be mounted directly on top of read-out layer 303, and sensor layer 301 may be mounted directly on top of section layer 302. The layers may be stacked such that sections within section layer 302 are aligned with signal processing circuitry sections of read-out layer 303. Furthermore, the layers may be stacked such that one or more sensing elements are aligned with a section. Sensing elements to be associated with a section may be contained within the section. For example, in a plan view of detector 300, sensing elements of a section may fit within the boundaries of a section. Furthermore, individual sections of section layer 302 may overlap with signal processing circuitry sections of read-out layer 303. In this manner, predefined areas may be established for associating sensing elements with sections and signal processing circuitry sections The sizes of sections and the number of sensing elements associated with a section may be varied. For example, while FIG. 3 illustrates four sensing elements in one section, embodiments of the disclosure are not so limited.

While FIG. 3 illustrates sensor layer 301, section layer 302, and read-out layer 303 as a plurality of discrete layers, it will be appreciated that sensor layer 301, section layer 302, and read-out layer 303 need not be provided as separate substrates. For example, a wiring path of section layer 302 may be provided in a sensor die including the plurality of sensing elements, or may be provided outside of the sensor die. Wiring paths may be patterned on sensor layer 301. Additionally, section layer 302 may be combined with read-out layer 303. For example, a circuit die may be provided that includes wiring paths of section layer 302 and signal processing circuitries of read-out layer 303. Thus, structures and functionalities of the various layers may be combined or divided.

In some embodiments, a detector may be provided in a two-die configuration. However, embodiments of the present disclosure are not so limited. For example, functions of a sensor layer, section layer, and read-out layer may be implemented in one die or in a package that may contain one or more dies.

Figure 4:
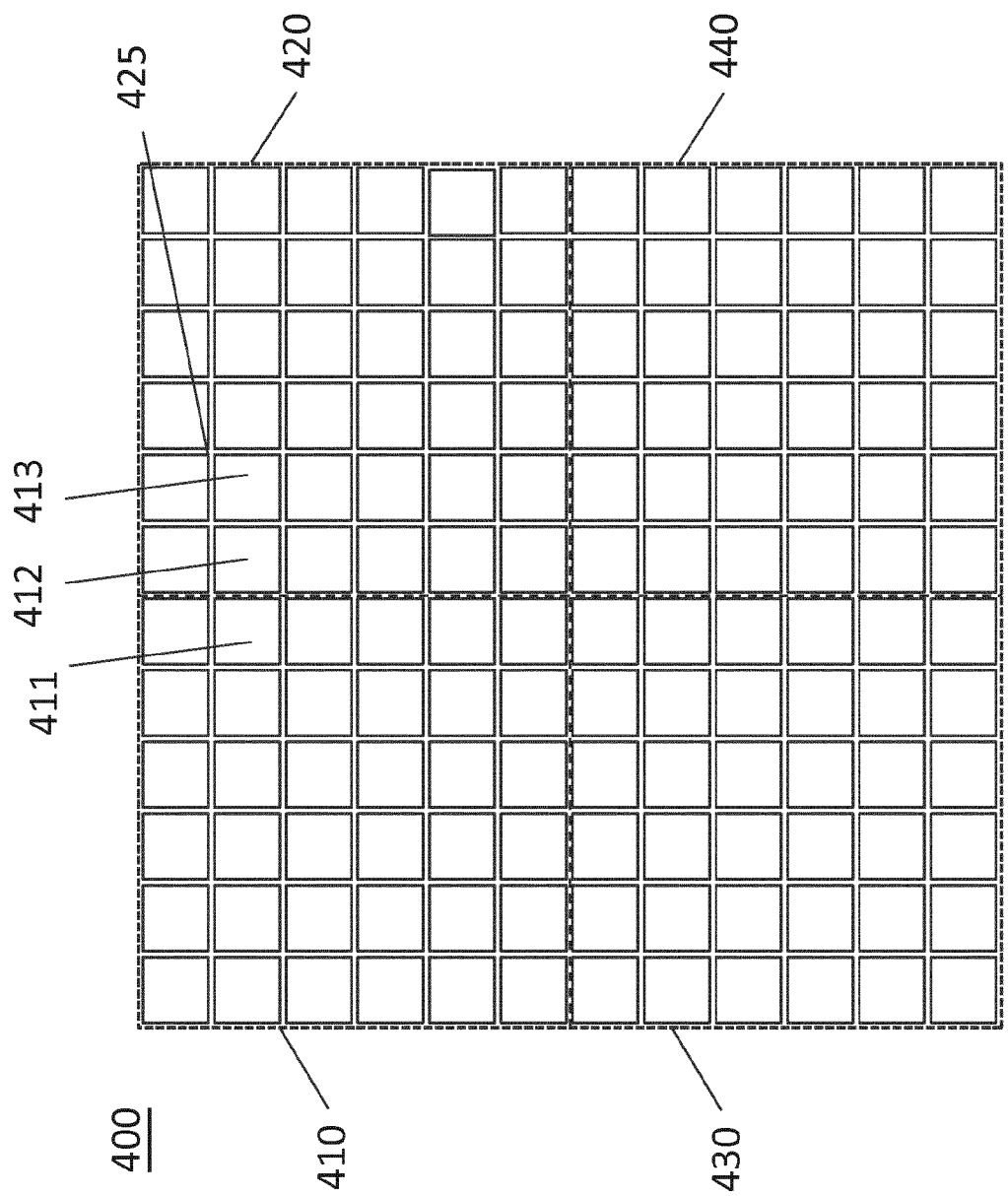
FIG. 4 is a diagram illustrating an exemplary surface of a detector array, consistent with embodiments of the present disclosure.

Reference is now made to FIG. 4, which illustrates an exemplary structure of a sensor surface 400 that may form a surface of electron detection device 244. There may be provided a plurality of sections, 410, 420, 430, and 440 that correspond to different regions of sensor surface 400. Each section of sensing elements may be capable of receiving at least a part of a beam spot emitted from a particular location from wafer 230, such as one of secondary electron beams 236, 238, and 240 as shown in FIG. 2.

Sensor surface 400 may comprise an array of sensing elements, including sensing elements 411, 412, and 413. Each of sections 410, 420, 430, and 440 may contain multiple sensing elements among the plurality of sensing elements. For example, section 410 may contain a first plurality of sensing elements, and section 420 may contain a second plurality of sensing elements, and so on. The first plurality of sensing elements and the second plurality of sensing elements may be mutually exclusive. A sensing element may be a diode. A sensing element may also be an element similar to a diode that can convert incident energy into a measurable signal. The sensing elements may comprise, for example, a PIN diode, avalanche diode, electron multiplier tube (EMT), etc., and combinations thereof. An area 425 may be provided between adjacent sensing elements. Area 425 may be an isolation area to isolate the sides and/or corners of neighboring pixels from one another. Area 425 may comprise an insulating material that is different from that of other areas of sensor surface 400. Area 425 may be provided as a square. In some embodiments, area 425 is not provided between adjacent sides of sensing elements.

The sensing elements may generate an electric current signal commensurate with the electrons received in the active area of a sensing element. A pre-processing circuit may convert the generated current signal into a voltage that may represent the intensity of a received electron beam spot. The pre-processing circuitry may comprise, for example, pre-amp circuitries coupled with a high speed transimpedance amplifier. Other circuitries may also be provided for other functions. For example, switch actuating circuitries may be provided that may control switching elements for connecting sensing elements to one another.

In some embodiments, a field programmable detector array may be provided with sensing elements having switching regions integrated between the sensing elements. For example, detectors may be provided such as some of those examples discussed in U.S. Application No. 62/555,032. A switching region may be provided between switching elements for merging the sensing elements, for example so that sensing elements are grouped when covered by the same electron beam spot. Circuitries for controlling the switching regions may be included in the signal processing circuitries of the read-out layer.

Some examples of detector and sensor layer structures will be discussed.

Figure 5:
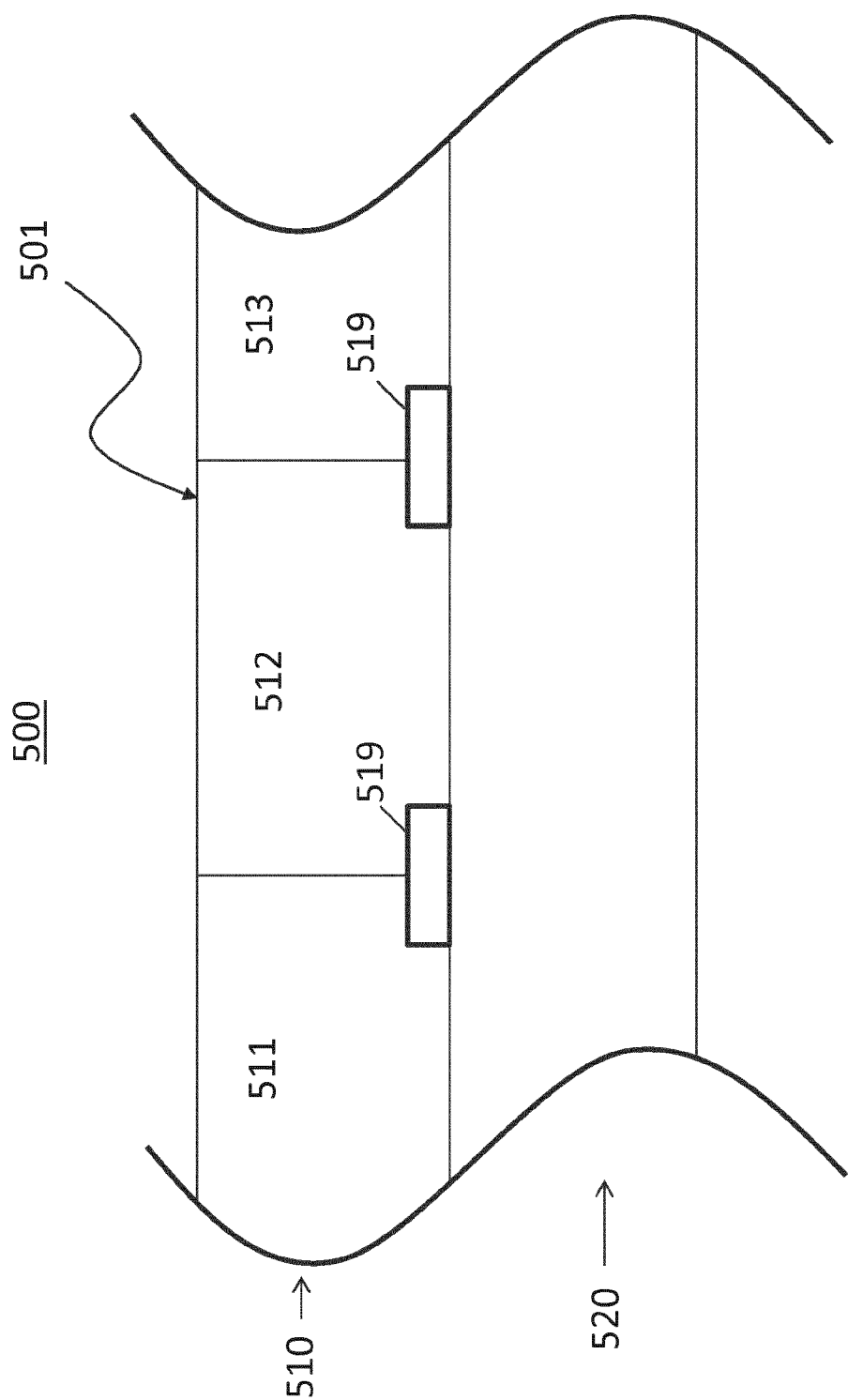
FIG. 5 is a diagram illustrating a cross sectional view of a detector, consistent with embodiments of the present disclosure.

Reference is now made to FIG. 5, which shows a simplified illustration of a layer structure of a detector 500. Detector 500 may be provided as detector 244 in an electron beam tool 104 as shown in FIG. 2. Detector 500 may be configured to have a plurality of layers stacked in a thickness direction, the thickness direction being substantially parallel to an incidence direction of an electron beam. The plurality of layers may include a sensor layer 510 and a circuit layer 520. Some layers are omitted for clarity. Sensor layer 510 may be provided with sensor surface 501 for receiving incident electrons. Sensing elements, for example sensing elements 511, 512, and 513 may be provided in sensing layer 510. Switching elements 519 may be provided between adjacent sensing elements in a horizontal direction in the cross sectional view. Switching elements 519 may be embedded in sensing layer 510.

In some embodiments, a switching region may be disposed in the active area of sensing elements. In other embodiments, the switching region may also be formed outside the active area of the sensing elements.

For example, sensor layer 510 may be configured as a diode where sensing elements 511, 512, and 513 are similar to sensing elements 411, 412, and 413, as discussed above. Furthermore, switching elements 519 may be configured as transistors, such as a MOSFET. Each of sensing elements 511, 512, 513 may comprise outputs for making electrical connections to circuit layer 520. Outputs may be integrated with switching elements 519, or may be provided separately. Outputs may be integrated in a bottom layer of sensor layer 510 that may be a metal layer.

Although FIG. 5 depicts sensing elements 511, 512, and 513 as discrete units when viewed in cross-section, such divisions may not actually be present. For example, the sensing elements of a detector may be formed by a semiconductor device constituting a PIN diode device that can be manufactured as a substrate with a plurality of layers including a p+ region, an intrinsic region, and an n+ region. Thus, sensing elements 511, 512, 513 may be contiguous in cross sectional view. Switching elements 519 may be integral with the sensing elements.

Circuit layer 520 is provided adjacent to sensor layer 510. Circuit layer 520 may represent section layer 302 and read-out layer 303 of a detector such as that discussed above with reference to FIG. 3. Circuit layer 520 may comprise line wires, interconnects, and various electronic circuit components. Circuit layer 520 may comprise a processing system. Circuit layer 520 may be configured to receive the output current detected in sensor layer 510.

Figure 6:
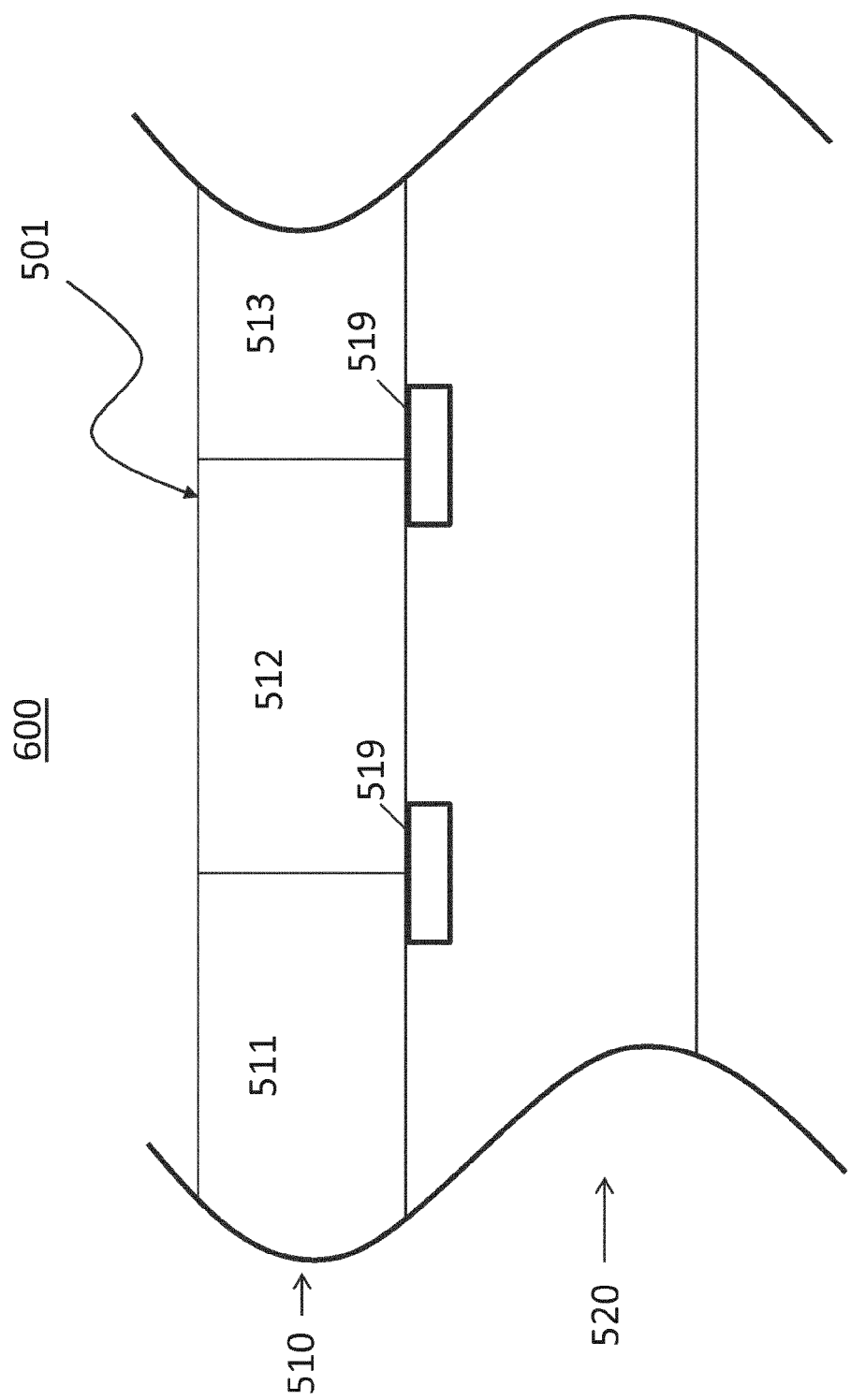
FIG. 6 is a diagram illustrating a cross sectional view of a detector, consistent with embodiments of the present disclosure.

Reference is now made to FIG. 6, which shows a simplified illustration of a layer structure of a further example of a detector 600, such as examples of detectors discussed in U.S. Application No. 62/560,122. As shown in FIG. 6, switching elements 519 may be provided between adjacent sensing elements in a horizontal direction in the cross sectional view. Switching elements 519 may be provided outside of sensor layer 510. For example, switching elements 519 may be embedded in circuit layer 520.

In some embodiments, individual sensing elements 511, 512, and 513 may be separated by an isolation area extending in the thickness direction. For example, sides of sensing elements 511, 512, and 513 that are parallel to the thickness direction may be isolated from each other by isolation areas.

Figure 7:
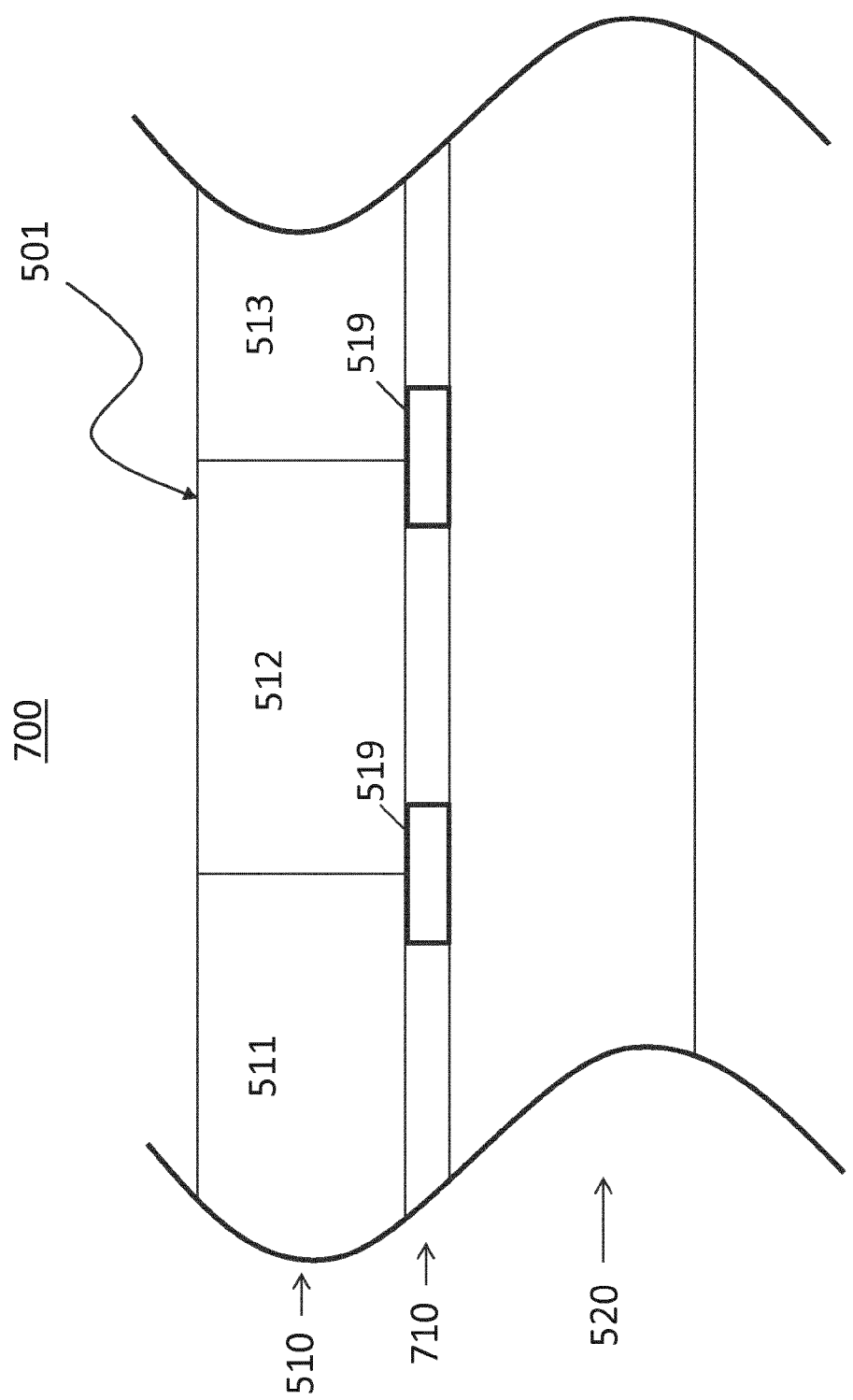
FIG. 7 is a diagram illustrating a cross sectional view of a detector, consistent with embodiments of the present disclosure.

In some embodiments, switching elements 519 may be formed in a separate die. As illustrated in FIG. 7, for example, a detector 700 is provided with a switch die 710. Switch die 710 may comprise the plurality of switching elements 519. Switch die 710 may be sandwiched between sensor layer 510 and circuit layer 520. Switch die 710 may be electrically connected to sensor layer 510 and circuit layer 520.

In some embodiments, switching elements may be integrated within the sensor layer, integrated within other layers, or may be provided partially or fully in existing layers. In some embodiments, for example, the sensor layer may contain wells, trenches, or other structures, wherein the switching elements are formed in those structures.

Figure 8:
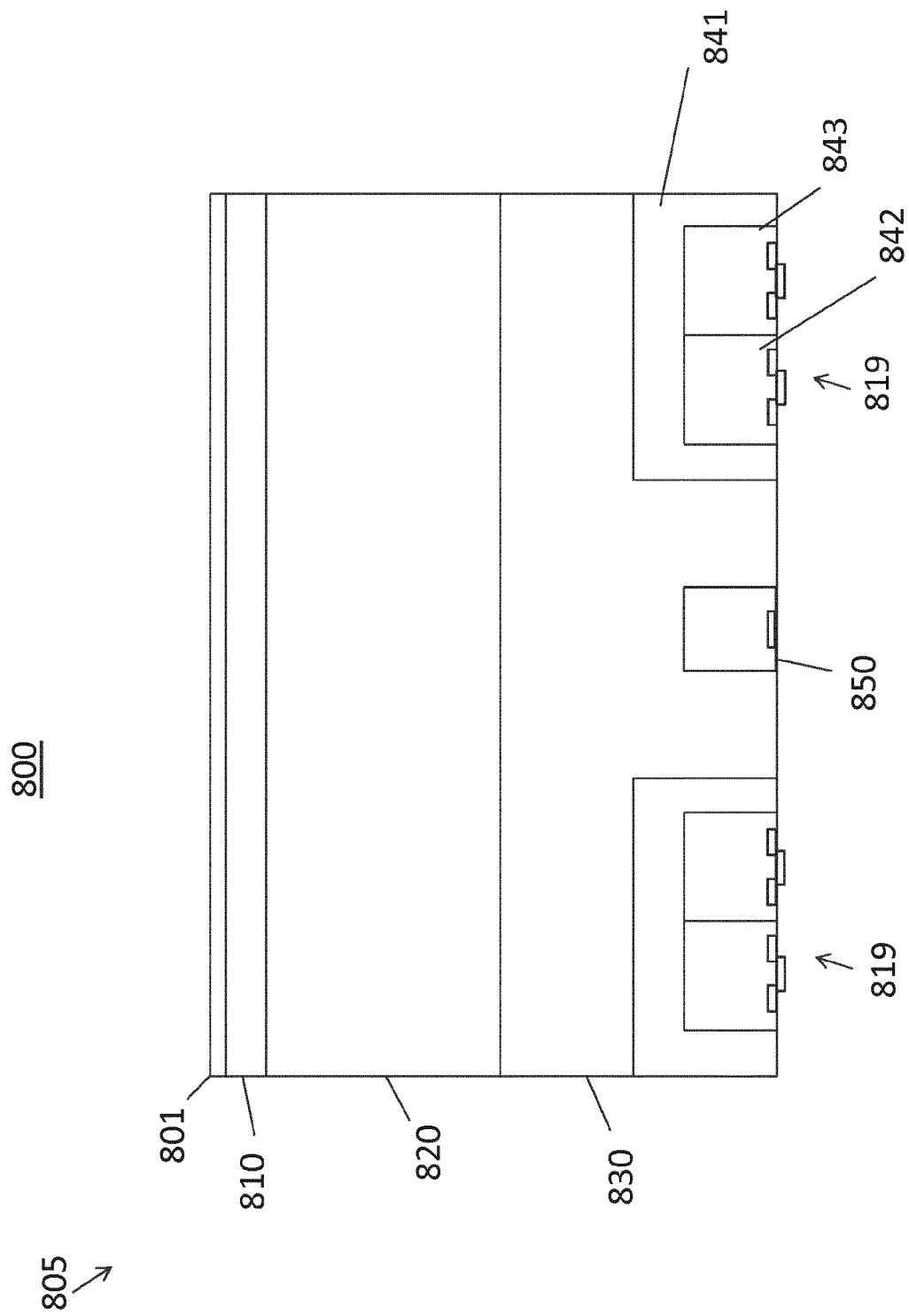
FIG. 8 is a diagram illustrating a cross sectional view of a detector, consistent with embodiments of the present disclosure.

FIG. 8 is a cross sectional view of a sensing element 800 with a built-in p-well and n-well for forming switches and other active and/or passive elements. Such elements may connect to sensing element 800 or other components. Sensing element 800 may form part of a sensor layer 805 that may be a sensor layer of a detector array, while a circuit layer and other layers are not shown. Sensing element 800 may comprise a diode device having a surface layer 801, a p+ region 810, a p-epitaxial region 820, an n− region 830, among others. Surface layer 801 may form a detection surface of a detector that receives incident electrons. Surface layer 801 may be a metal layer formed by aluminum, for example. Other conductive materials may also be used. On an opposite side from surface layer 801, there may be provided an electrode 850 as a charge collector. Electrode 850 may be configured to output a current signal representing the amount of electrons received in the activated area of sensing element 800.

Switching elements 819 may be formed by metal oxide semiconductor devices. For example, a plurality of CMOS devices may be formed in a back side of sensor layer 805. As an example of a CMOS device, there may be provided a deep p-well 841, an n-well 842, and a p-well 843. A process of fabricating CMOS devices may comprise etching and patterning, for example, among other techniques.

Although only one sensing element 800 is shown, it will be understood that sensor layer 805 may be made up of a plurality of sensing elements. The sensing elements may be contiguous in cross sectional view.

In operation, when electrons impinge on surface layer 801, supporting layers of the substrate may be flooded with charge carriers from p+ region 810. In this way, sensing elements may be activated by an electron beam spot and may generate an output signal, such as electron beam current. When an electron beam spot covers multiple adjacent sensing elements, the sensing elements may be grouped together ("merged") for collecting current. Sensing elements may be merged by turning on switching elements between them.

A detector may be configured so that individual sensing elements may communicate with external components via, for example, signal and/or data lines and address signals. A detector may be configured to actuate switches so that two or more sensing elements become grouped (merged) together and may collect current together. As can be seen in FIG. 8, sensing elements may be provided without isolation areas on horizontal sides. Thus, when sensing elements are activated, all of the area under surface layer 801 may become active. When no isolation area is provided between adjacent sensing elements, dead area between them may be eliminated.

Figure 9:
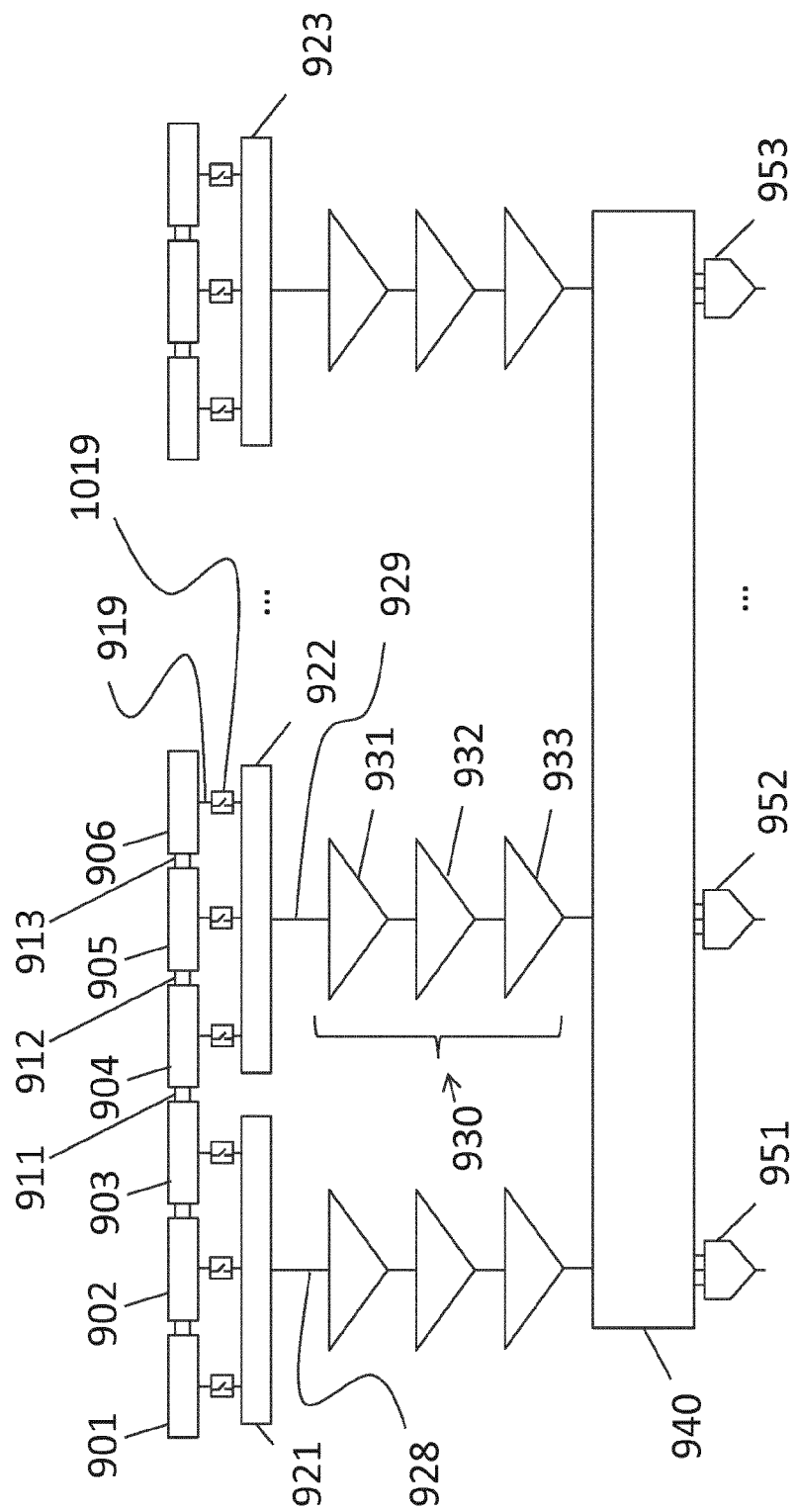
FIG. 9 is a diagram representing a structure of a detector, consistent with embodiments of the present disclosure.

Reference is now made to FIG. 9, which shows a further representation of a section arrangement consistent with exemplary embodiments of the disclosure. There may be provided a plurality of sensing elements 901, 902, 903, 904, 905, 906, and so on. The plurality of sensing elements may make up a sensor layer that may form a detection surface of electron detection device 244, as discussed above with reference to FIG. 2. The sensor layer may comprise switching regions, such as switching elements 911, 912, and 913, that may be provided between adjacent sensing elements. Switching elements 911, 912, and 913 may correspond to switching elements 519 or 819, as discussed above with respect to FIGS. 5-8. For example, switching elements 911, 912, and 913 may be configured to group two or more adjacent sensing elements together when they are turned on.

A plurality of sections may be provided, such as sections 921, 922, and 923. Sections may be configured to electrically connect one or more sensing elements. Sections may be configured to output a common output. A first section may connect one or more sensing elements of a first plurality of sensing elements among the plurality of sensing elements to an output, and a second section may connect one or more sensing elements of a second plurality of sensing elements among the plurality of sensing elements to an output. For example, as shown in FIG. 9, section 921 may be electrically connected to a first plurality of sensing elements including sensing elements 901, 902, and 903, and connected to a first output 928. Section 922 may be electrically connected to a second plurality of sensing elements including sensing elements 904, 905, and 906, and connected to a second output 929. The sections may connect to the sensing elements via a plurality of wiring paths 919 and switches 1019. The sections may be configured to output electrical signals to signal processing circuitries and further circuit elements. For example, section 922 may output electrical signals to signal processing circuitry 930.

Signal processing circuitry 930 may include one or more signal processing circuitries for processing output of the connected sensing elements. For example, signal processing circuitry 930 may comprise a pre-amplifier 931, such as a transimpedance amplifier (TIA) or a charge transfer amplifier (CTA), a post-amplifier 932, such as a variable gain amplifier (VGA), and a data converter 933, such as an analog-to-digital converter (ADC). One or more of the above components may be omitted. Additionally, other circuitries may also be provided for other functions. For example, switch actuating circuitries may be provided that may control switching elements for connecting sensing elements to one another, or other switches. Furthermore, in some embodiments, an analog output line may be provided that may be read by an analog path, in addition to or instead of being sent to the ADC.

A digital switch 940 may be provided. Digital switch 940 may include a switch matrix. Digital switch 940 may include a multiplexer. For example, a multiplexer may be configured to receive a first number of inputs and generate a second number of outputs. The first number and the second number may correspond with parameters of the detector, such as total number of sensing element sections, and with parameters of the apparatus 104, such as number of beam (or beamlets) generated from electron source 202. Digital switch 940 may communicate with external components via data line and address signals. Digital switch 940 may also control data read/write. Digital switch 940 may also be configured to control manipulation of switching elements. Digital switch 940 may be configured to generate output signals via a plurality of output paths 951, 952, 953, and so on. Other components, such as relays, etc., may be connected to output channels of the digital switch 940. Thus, the plurality of sections may act as separate data highways for detector signals.

It will be understood that various components may be inserted at various stages in the representation of FIG. 9.

Furthermore, one or more switches may be provided between sensing elements and signal processing circuitries associated with the sections. Switches may be provided in line with or in addition to wiring paths of the sections. For example, as shown in FIG. 9, a switch 1019 is provided in-line with each wiring path 919. Switches 1019 may be arranged between the plurality of sensing elements and sections 921, 922, and 923. When such switches are provided, inactive sensing elements may be disconnected to reduce noise pickup, for example, among other technical effects.

In some embodiments of the present disclosure, analog switches are combined before signal processing paths, and digital switches are disposed after the signal processing paths. In this manner, a detector may be configured so as to achieve the highest flexibility of interconnections between the sensing elements and the maximum combinations of those interconnections. A system may be realized without the difficulties of implementing a pure analog switch matrix or a pure digital switch matrix. Further, according to some aspects of the present disclosure, scaling up of a detection system may be achieved. Whereas in a comparative example, solutions that rely on a pure analog switch matrix or a pure digital switch matrix may encounter difficulties when scaling the system up.

Figure 10:
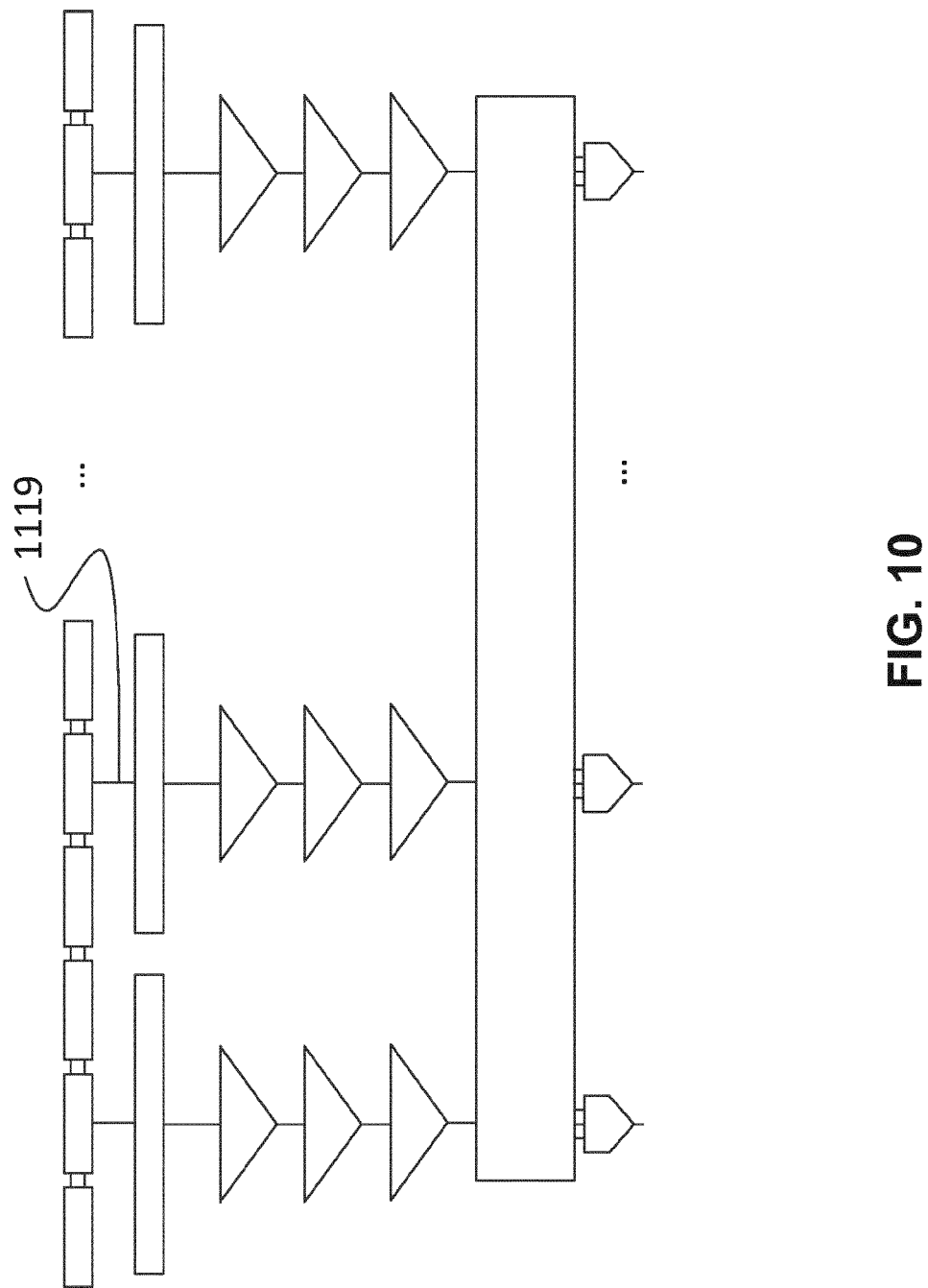
FIG. 10 is a diagram representing a structure of a detector, consistent with embodiments of the present disclosure.

In some embodiments, the plurality of sensing elements may be connected to sections via varying numbers of wiring paths. A section may connect to one or multiple sensing elements among a first plurality of sensing elements. For example, while FIG. 9 illustrates each of the sensing elements connected to a section via its own wiring path, such as wiring path 919, some such wiring paths may be omitted. As shown in FIG. 10, a plurality of sensing elements may be configured to connect to a section via only one wiring path 1119. For example, only one sensing element among the first plurality of sensing elements associated with one section may have a wiring path that is connected to the section. Only one sensing element among the second plurality of sensing elements associated with another section may have a wiring path that is connected to the section, and so on. Thus, if an electron beam spot is incident on the detector, a signal generated from activated sensing elements may only be transmitted through the sections if the sensing element having the wiring path is activated. Merging of sensing elements may allow detection signals generated in adjacent sensing elements to be transmitted through the wired sensing element. Such an arrangement may simplify manufacturing of a detector.

Figure 11:
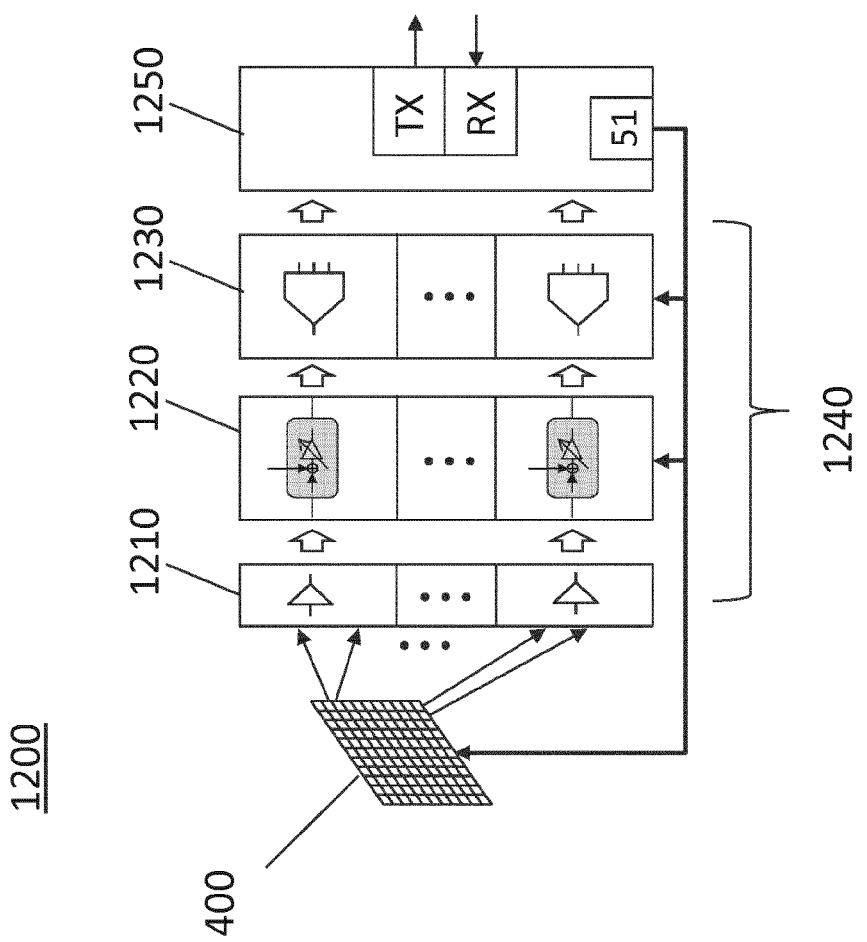
FIG. 11 is a diagram representing a detection system, consistent with embodiments of the present disclosure.

Reference is now made to FIG. 11, which shows a further representation of a section arrangement consistent with exemplary embodiments of the disclosure. A detection system 1200 may be provided that includes a plurality of sensing elements, a plurality of sections 1240, and a digital interface 1250. The plurality of sensing elements may form sensor surface 400, for example as discussed above with respect to FIG. 4. The plurality of sections 1240 may be made up of a signal conditioning circuit array 1210, an analog signal processing path array 1220, and an ADC array 1230 that are each divided into a plurality of discrete units. That is, sections 1240 may be regarded as portions of signal conditioning circuit array 1210, analog signal processing path array 1220, and ADC array 1230. One section may be associated with a first plurality of sensing elements, one element of signal conditioning circuit array 1210, one element of analog signal processing path array 1220, and one element of ADC array 1230. For example, one section may include signal conditioning circuitry that is configured to process an output of one or more sensing elements. One section may also include a signal processing path that is configured to provide gain and offset control. One section may also include an ADC circuit.

Detection system 1200 may be configured so that outputs from the plurality of sensing elements may be routed to signal conditioning circuit array 1210 and pass through various sections. One section of signal conditioning circuit array 1210 may be configured to receive one or more outputs from different sensing elements. Accordingly, electron detection current representing the intensity of at least a portion of an electron beam spot signal may be combined and processed together. For example, the electron detection current of one group of sensing elements may be processed through a respective section and passed on to digital interface 1250. Thus, digital interface 1250 may receive outputs of sections downstream of ADC circuitry. Digital interface 1250 may include a digital switch, a digital control unit, or a controller. Digital interface 1250 may communicate with analog signal processing path array 1230, ADC array 1230, and the detector array. Digital interface 1250 can also send and receive communications from, for example, a deflection and image control (DIC) unit via a transceiver, which may include a transmitter TX and receiver RX. A controller 51 may be configured to execute imaging control.

In some embodiments, a section may comprise a wiring path. A network of wiring path sections may be provided to route signals to corresponding signal processing circuitries. Further, in some embodiments, the sections may comprise such signal processing circuitries.

Figure 12:
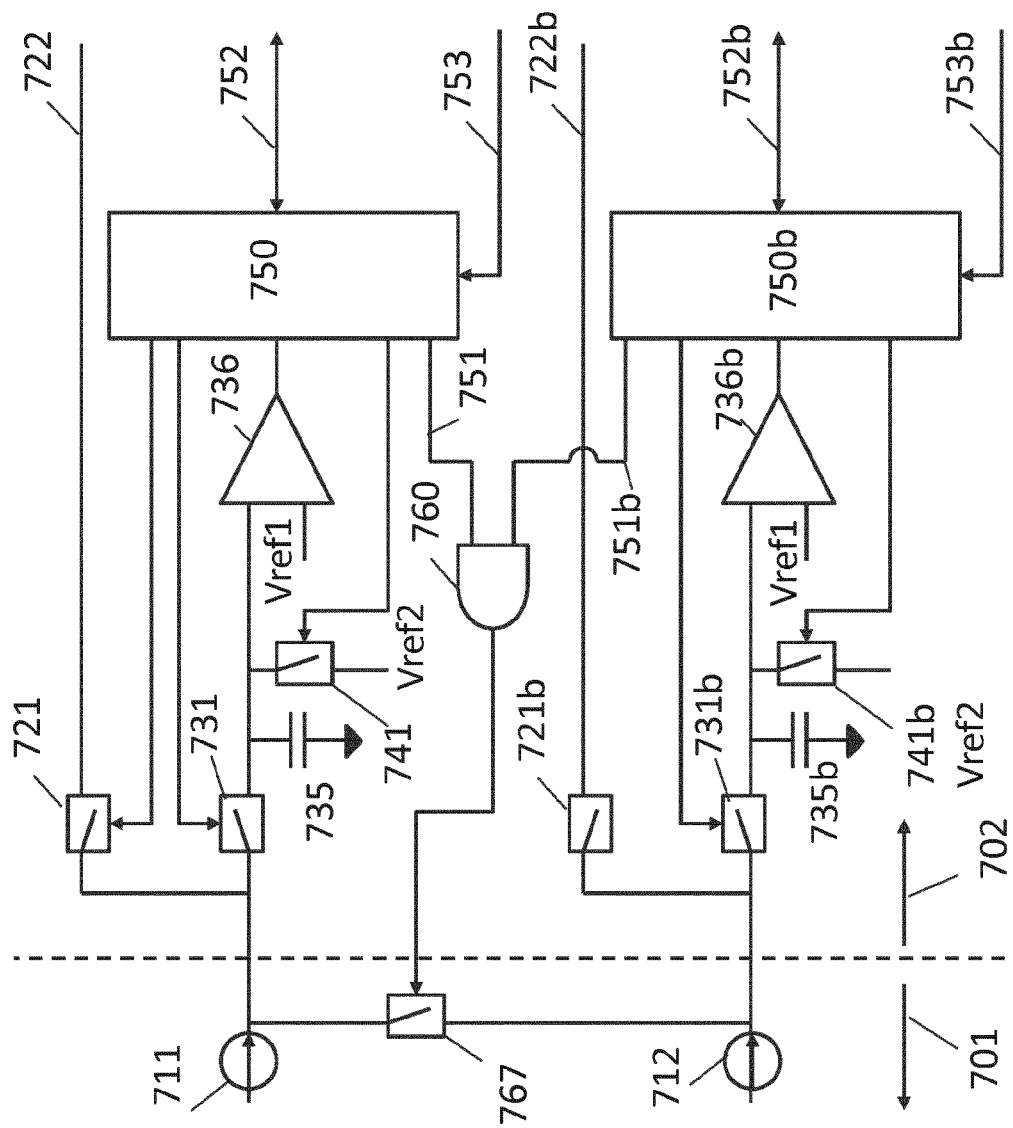
FIG. 12 is a circuit diagrams illustrating a sensor layer and circuit layer of a detector, consistent with embodiments of the present disclosure.

FIG. 12 illustrates a circuit schematic that may be included in a section arrangement consistent with embodiments of the disclosure. A dashed line may represent a division between a sensor die 701 and a circuit die 702. A layout such as that shown in circuit die 702, for example, may represent a circuit provided in circuit layer 520, as discussed above with reference to FIG. 5. A layout such as that shown in sensor die 701, for example, may represent a plurality of sensing elements with a switching element 767 therebetween. For example, a layout such as that shown in sensor die 701 may represent an arrangement of sensor layer 510, as discussed above with reference to FIG. 5. It should be understood that switching element 767 may be provided outside of the active area of the electron sensing elements in some embodiments.

The circuit arrangement of FIG. 12 may be one example of some signal processing circuitry that may be provided in a section. For example, circuitry similar to that shown in FIG. 12 may be applied to implement a detector wherein two or more sensing elements can be merged. It should be noted, however, that circuitry to implement the aforementioned detector may also be provided outside of the circuitry that is provided in a section, in some embodiments.

Circuitry for implementing sensing element merger will now be described. In an exemplary process of signal detection, one pixel in a detector may be associated with one sensing element of a sensing array. Thus, a first pixel may be configured to generate a PIN diode current 711. At the start of a process for PIN diode signal intensity detection, a switch 721 and a switch 731 may be set to be open, while a switch 741 is set to be closed. Thus, voltage of a capacitor 735 may be reset to Vref2.

Next, switch 721 and switch 741 may be set to be open, while switch 731 is set to be closed. In this state, capacitor 735 begins charging and generates a voltage. Capacitor 735 may be configured to charge for a predetermined period of time, for example t_charge, after which switch 731 is set to be open.

Then, comparator 736 compares the voltage at capacitor 735 to a reference value Vref1. Reference value Vref1 may be set as a predetermined signal level. Based on the reference value, a circuit may be configured to output a signal that indicates that the sensing element is gathering current from an incident electron beam. Thus, the reference value may be a suitable value that indicates that the signal level from the PIN diode is high enough to be considered to be gathering current from an incident electron beam included within a beam spot. In comparator 736, if voltage from capacitor 735 is higher than Vref1, an output signal is sent to block 750.

Vref1 may be set so that each sensing element can be controlled to be included within an outer boundary of a beam spot. The value t_charge may be determined based on local logic or an external circuit, for example through a data line 752 communicating with block 750. Logic blocks and circuitry components may be set so that functions such as signal intensity detection and pixel grouping determination may occur locally. However, signal intensity of each sensing element may be collected, and determinations can be made via an external path. For example, an analog signal path and ADC may communicate with an external controller or external circuitry via an analog signal line 722 and a data line. For example, signal line 722 may connect to pre-amp circuit 931, as discussed above with reference to FIG. 9.

Each pixel in a sensing array may be associated with a sensing element that generates current based on incident electrons on the sensing element, and communicates with signal processing circuitry. Pixels may be connected to circuitry such as that discussed above with reference to the first pixel configured to generate PIN diode current 711. Thus, a second pixel may be configured to generate a PIN diode current 712, and so on. PIN diode current 712 may be connected to corresponding circuit elements, for example, switch 721*b*, switch 731*b*, switch 741*b*, capacitor 735*b*, comparator 736*b*, block 750*b*, etc.

Using the output current from the active sensing element, the circuit layer may be configured to generate a status indicator. The status indicator may be configured to trigger a function for implementing merging of pixels. Various methods for achieving sensing element merging may be provided.

In one such method for merging pixels, sensing element merger may be achieved according to a signal strength flag in a local logic circuit. If a first pixel and a second pixel have a strong signal strength, the two pixels may be merged. For example, PIN diode current 711 and PIN diode current 712 may both have high current values. Namely, voltage at capacitor 735 and voltage at capacitor 735*b* may both be higher than Vref1. Then, a switch 767 is set to be closed so as to merge the two pixels.

If at least one of the first pixel and the second pixel has a weak signal, that is, either voltage at capacitor 735 or capacitor 735*b* is less than Vref1, switch 767 is set to be open so that the two pixels are not merged.

Switch 767 may be configured as an element to implement a switch between two sensing elements. Switch 767 may be located in sensor die 701. Switch 767 may be embedded in sensor die 701. In some embodiments, switch 767 may be provided outside of sensor die 701. Switch 767 may be configured as a transistor, such as a MOSFET.

Criteria for determining a size of sections will be discussed with reference to FIG. 13.

In some applications, a multi-beam apparatus may be used to generate a plurality of beamlets. Pitches of the beamlets may be determined by the structure of apparatus 104, for example, source conversion unit 212 as shown in FIG. 2. Pitches of beamlets may be set based on a variety of parameters. For example, pitches may be set so as to ensure mechanical availability and mechanical stabilization, among others. The more beamlets that are available, the higher the inspection throughput that may be achieved. Thus, a charged particle beam system may be used that has a high density of beamlets.

Accordingly, a plurality of beams or beamlets may be incident on a detector surface. FIG. 13 shows a detector surface with a plurality of sensing elements and a plurality of beamlets incident thereon. For example, beamlets may be configured to be projected onto a sample and subsequently received on the detector in an array pattern, such as a grid pattern. The grid pattern may be an arbitrary shape. For example, the grid pattern may be square, rectangular, tiled, etc. While four beamlet spots are shown in FIG. 13, embodiments of the disclosure are not so limited. The square grid pattern of beamlet spots may repeat arbitrarily.

Figure 13:
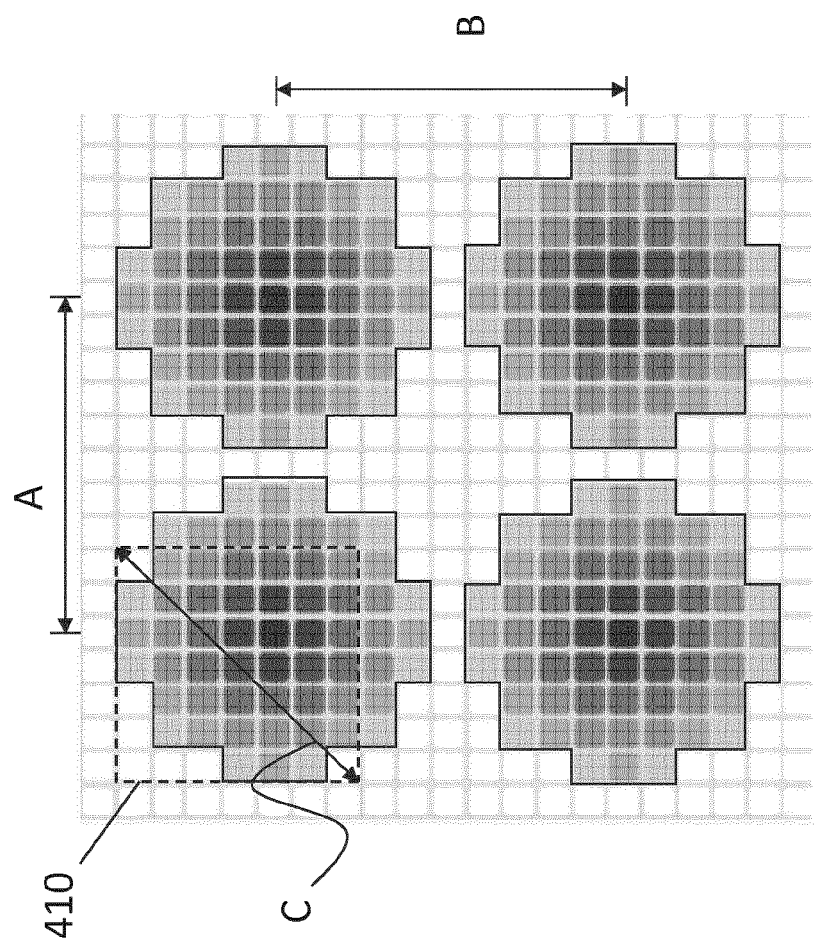
FIG. 13 is a diagram illustrating an exemplary surface of a detector array, consistent with embodiments of the present disclosure.

As shown in FIG. 13, beamlets are spaced so as to have a center-to-center distance of A in the first (horizontal) direction, and B in the second (vertical) direction. Values of A and B may be equal.

The detector may have a plurality of sections, as discussed above. For example, a section 410 is shown wherein sensing elements associated with the section are contained within the dashed line box. The sections may be provided uniformly over the surface of the detector.

Criteria for determining a size of a section may be that the diagonal size of the section is less than the length of the smallest spacing between adjacent beam spots. For example, the distance C may be set to be less than A. Thus, under any variety of differing imaging conditions due to, for example varying alignment, beam shift, etc., at most only one beam center may fall into one section. In this way, it may be guaranteed that there will be enough signal processing circuitries and signal paths to accommodate signal processing and readout of the beams projected on an area of the detector surface.

Figure 14A:
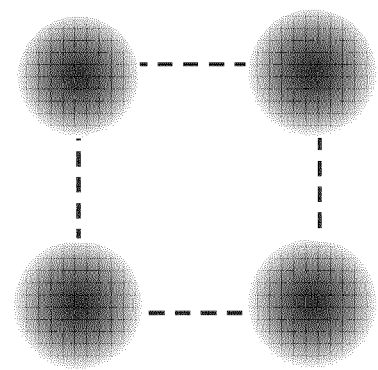
FIG. 14A to FIG. 14C are diagrams illustrating relationships between electron beam spots and section size, consistent with embodiments of the present disclosure.
Figure 14B:
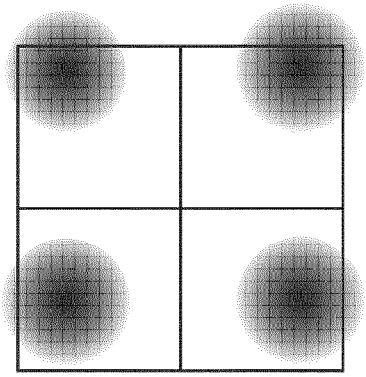
Figure 14C:
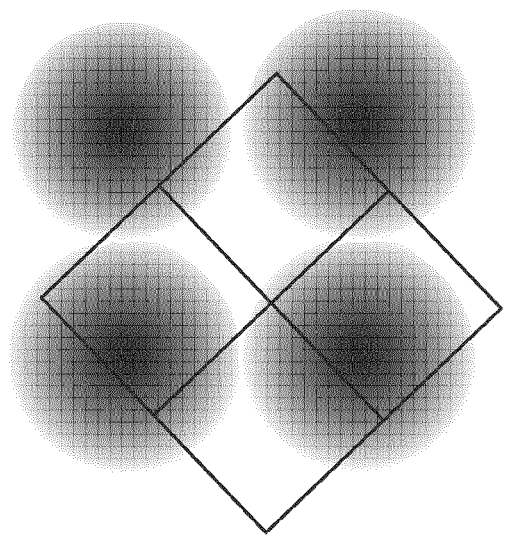

As shown in FIGS. 14A-14C, under varying conditions, sections sized so as to have a diagonal distance less than the smallest pitch of beam spots may allow all beam spots to be accommodated in respective sections. For example, FIG. 14A shows an arrangement of beam spots that have a regular fixed pitch indicated by dashed lines. FIG. 14B shows that no two beam spots can fully fit within one section. Nor can the centers of two beams fit within one section. FIG. 14C shows beam spots having the same pitch but greater size. Regardless of beam spot size, at most only one beam spot center will be accommodated in one section. Furthermore, even if the section arrangement is not aligned with the beam grid (for instance when the grid pattern is rotated relative to the section arrangement), no situation can arise where the centers of two beam spots are in one section. Thus, sensing elements associated with one section may have their output signals routed through respective sections that may have their own signal processing circuitries and wiring paths. Sensing elements grouped together for a beam spot may then have the signal of that beam spot routed through one signal processing circuitry of one of the sections to which the sensing elements in the group are associated. Thus, the length of signal path for a beam spot may be minimized. Furthermore, bandwidth may be improved.

It should be noted that in some situations, activated sensing elements from two or more different beam spots may be contained within one section. However, with pixel merging, for example, sensing elements that are covered by the same beam spot may be merged so that their output is processed together. For example, the section that contains the beam spot center may be the section used for processing all the signals of the activated sensing elements associated with one beam spot. Therefore, sensing elements on the peripheries of the beam spot may use a wiring path of another section rather than the one in which the section was originally contained. Accordingly, the sensing elements on the peripheries of the beam spot may actually use a wiring path that is slightly longer than if the sensing element used the wiring path for the section stacked immediately below it. In this way, the detector array may remain flexible. Thus, at a given time, the number sensing elements that are associated with one section and thereby processed by the section may be less than, equal to, or larger than the number of sensing elements that may be contained within the predefined size of the section.

The embodiments may further be described using the following clauses:

1. A detector comprising:
   a substrate including a plurality of sensing elements;
   a plurality of sections including a first section connecting one or more sensing elements of a first plurality of sensing elements to a first output and a second section connecting one or more sensing elements of a second plurality of sensing elements to a second output.

2. The detector of clause 1, wherein the plurality of sections includes a wiring path and signal processing circuitries.

3. The detector of one of clauses 1 and 2, further comprising:
   a plurality of circuitries configured to process outputs of the plurality of sensing elements, wherein a first circuitry of the plurality of circuitries is connected to the first section and a second circuitry of the plurality of circuitries is connected to the second section.

4. The detector of clause 3, further comprising:
a switch provided on a wiring path between each of the plurality of sensing elements and the plurality of circuitries.

5. The detector of any of clauses 1 to 4, further comprising:
a sensor die that includes the substrate; and
a circuit die that includes one or more circuits configured to process output of the plurality of sensing elements.

6. The detector of clause 5, wherein the sensor die and the circuit die are stacked together so that the first plurality of sensing elements is adjacent to the first section and the second plurality of sensing elements is adjacent to the second section.

7. The detector of any of clauses 1 to 6, further comprising:
at least one switching region configured to connect two or more of the plurality of sensing elements.

8. The detector of clause 7, wherein the at least one switching region includes a switching region provided between each of the plurality of sensing elements.

9. The detector of clause 7, wherein in a cross sectional view of the substrate, the at least one switching region is integral with the two or more of the plurality of sensing elements.

10. The detector of clause 7, wherein the switching region is in an active area of the plurality of sensing elements.

11. The detector of clause 7, wherein the switching region is outside an active area of the plurality of sensing elements.

12. The detector of any of clauses 1 to 11, wherein the plurality of sections each include a signal processing path.

13. The detector of clause 12, wherein the signal processing path includes amplifiers coupled with a data converter.

14. A detection system comprising:
a detector array including a plurality of sensing elements;
a plurality of sections including a first section connecting a first plurality of sensing elements to a first output and a second section connecting a second plurality of sensing elements to a second output; and
an interface.

15. The detection system of clause 14, wherein the plurality of sections includes a wiring path and signal processing circuitries.

16. The detection system of one of clauses 14 and 15, further comprising:
a plurality of circuitries configured to process outputs of the plurality of sensing elements, wherein a first circuitry of the plurality of circuitries is connected to the first section and a second circuitry of the plurality of circuitries is connected to the second section.

17. The detection system of clause 16, further comprising:
a switch provided on a wiring path between each of the plurality of sensing elements and the plurality of circuitries.

18. The detection system of any of clauses 14 to 17, wherein the interface includes a digital switch matrix.

19. The detection system of any of clauses 14 to 18, further comprising:
a sensor die that includes the plurality of sensing elements; and
a circuit die that includes one or more circuits configured to process output of the plurality of sensing elements.

20. The detection system of clause 19, wherein the sensor die and the circuit die are stacked together so that the first plurality of sensing elements is adjacent to the first section and the second plurality of sensing elements is adjacent to the second section.

21. The detection system of any of clauses 14 to 20, further comprising:
at least one switching region configured to connect two or more of the plurality of sensing elements.

22. The detection system of clause 21, wherein the at least one switching region includes a switching region provided between each of the plurality of sensing elements.

23. The detection system of clause 21, wherein in a cross sectional view of the detector, the at least one switching region is integral with the two or more of the plurality of sensing elements.

24. The detection system of clause 21, wherein the switching region is in an active area of the plurality of sensing elements.

25. The detector of clause 21, wherein the switching region is outside an active area of the plurality of sensing elements.

26. The detection system of any of clauses 14 to 25, wherein the plurality of sections each include a signal processing path.

27. The detection system of clause 18, wherein the signal processing path includes amplifiers coupled with a data converter.

28. The detection system of any of clauses 14 to 27, wherein the interface is configured to execute imaging control.

29. A charged particle beam system comprising:
a charged particle beam source configured to generate a plurality of charged particle beams;
a detector configured to receive the plurality of charged particle beams, wherein the detector includes:
a plurality of sensing elements; and
a plurality of sections including a first section connecting a first plurality of sensing elements to a first output and a second section connecting a second plurality of sensing elements to a second output.

30. The charged particle beam system of clause 29, wherein the plurality of sections includes a wiring path and signal processing circuitries.

31. The charged particle beam system of one of clauses 29 and 30, further comprising:
a plurality of circuitries configured to process outputs of the plurality of sensing elements, wherein a first circuitry of the plurality of circuitries is connected to the first section and a second circuitry of the plurality of circuitries is connected to the second section.

32. The charged particle beam system of clause 31, further comprising:
a switch provided on a wiring path between each of the plurality of sensing elements and the plurality of circuitries.

33. The charged particle beam system of any of clauses 29 to 32, further comprising:
a sensor die that includes the plurality of sensing elements; and
a circuit die that includes one or more circuits configured to process output of the plurality of sensing elements.

34. The charged particle beam system of clause 33, wherein the sensor die and the circuit die are stacked together so that the first plurality of sensing elements is adjacent to the first section and the second plurality of sensing elements is adjacent to the second section.

35. The charged particle beam system of any of clauses 29 to 34, further comprising:
    at least one switching region configured to connect two or more of the plurality of sensing elements.
36. The charged particle beam system of clause 35, wherein the at least one switching region includes a switching region provided between each of the plurality of sensing elements.
37. The charged particle beam system of clause 35, wherein in a cross sectional view of the detector, the at least one switching region is integral with the two or more of the plurality of sensing elements.
38. The charged particle beam system of clause 35, wherein the switching region is in an active area of the plurality of sensing elements.
39. The charged particle beam system of clause 35, wherein the switching region is outside an active area of the plurality of sensing elements.
40. The charged particle beam system of any of clauses 29 to 39, wherein the plurality of sections each include a signal processing path.
41. The charged particle beam system of clause 40, wherein the signal processing path includes amplifiers coupled with a data converter.
42. The charged particle beam system of any of clauses 29 to 41, wherein the plurality of sections are sized so that a diagonal distance of each section is less than a pitch of the plurality of charged particle beams.
43. The detector of any of clauses 1 to 13, wherein each of the first plurality of sensing elements is connected with the first output by a wiring path.
44. The detector of any of clauses 1 to 13, wherein only one sensing element among the first plurality of sensing elements is connected with the first output by a wiring path.

The block diagrams in the figures illustrate the architecture, functionality, and operation of possible implementations of systems, methods, and computer hardware/software products according to various exemplary embodiments of the present disclosure. In this regard, each block in a schematic diagram may represent certain arithmetical and/or logical operation processing that may be implemented using hardware such as an electronic circuit. Blocks may also represent a module, segment, or portion of code which comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the present invention is not limited to the exact construction that has been described above and illustrated in the accompanying drawings, and that various modifications and changes can be made without departing from the scope thereof. For example, while some exemplary embodiments discuss sections that are square in shape, other arrangements may be implemented such as triangular, hexagonal, etc. Sections may have shapes that are geometrically similar to those of the sensing elements associated with them. Sensing elements themselves may be formed in shapes other than square or rectangular.

What is claimed is:
1. A detector comprising:
    a substrate including a plurality of sensing elements; and
    a plurality of adjacent sections having a substantially uniform size and shape and including a first section connecting a first array of adjacent sensing elements of the plurality of sensing elements to a first output and a second section connecting a second array of adjacent sensing elements of the plurality of sensing elements to a second output,
    wherein the first array of adjacent sensing elements is located in a first region of a surface of the substrate and the second array of adjacent sensing elements is located in a second region of the surface of the substrate, the first region being different from the second region;
    further comprising:
    at least one switching region configured to connect a first sensing element and a second sensing element of the plurality of sensing elements to allow charge to flow from the first sensing element to the second sensing element.
2. The detector of claim 1, wherein the plurality of adjacent sections includes a wiring path and signal processing circuitries.
3. The detector of claim 1, further comprising:
    a plurality of circuitries configured to process outputs of the plurality of sensing elements, wherein a first circuitry of the plurality of circuitries is connected to the first section and a second circuitry of the plurality of circuitries is connected to the second section.
4. The detector of claim 3, further comprising:
    a switch provided on a wiring path between each of the plurality of sensing elements and the plurality of circuitries.
5. The detector of claim 1, further comprising:
    a sensor die that includes the substrate; and
    a circuit die that includes one or more circuits configured to process output of the plurality of sensing elements.
6. The detector of claim 5, wherein the sensor die and the circuit die are stacked together so that the first array of adjacent sensing elements is adjacent to the first section and the second array of adjacent sensing elements is adjacent to the second section.
7. The detector of claim 1, wherein the at least one switching region includes a switching region provided between each of the plurality of sensing elements.
8. The detector of claim 1, wherein in a cross sectional view of the substrate, the at least one switching region is integral with the first sensing element and the second sensing element.
9. The detector of claim 1, wherein the switching region is in an active area of the plurality of sensing elements.
10. The detector of claim 1, wherein the switching region is outside an active area of the plurality of sensing elements.
11. The detector of claim 1, wherein the plurality of adjacent sections each include a signal processing path.
12. The detector of claim 11, wherein the signal processing path includes amplifiers coupled with a data converter.
13. A detection system comprising:
    a detector array including a plurality of sensing elements;
    a plurality of adjacent sections having a substantially uniform size and shape and including a first section connecting a first array of adjacent sensing elements of the plurality of sensing elements to a first output and a second section connecting a second array of adjacent sensing elements of the plurality of sensing elements to a second output; and an interface, wherein the first array of adjacent sensing elements is located in a first region of a surface of the detector and the second array of adjacent sensing elements is located in a second region of the surface of the detector, the first region being different from the second region;

further comprising:

at least one switching region configured to connect a first sensing element and a second sensing element of the plurality of sensing elements to allow charge to flow from the first sensing element to the second sensing element.

14. The detection system of claim 13, further comprising:

a sensor die that includes the plurality of sensing elements; and a circuit die that includes one or more circuits configured to process output of the plurality of sensing elements.

15. A charged particle beam system comprising:

a charged particle beam source configured to generate a charged particle beam; and the detector of claim 1.

* * * * *